United States Patent
Benoist et al.

(10) Patent No.: US 9,508,434 B2
(45) Date of Patent: Nov. 29, 2016

(54) PROGRAMMABLE-RESISTANCE NON-VOLATILE MEMORY

(71) Applicant: Commissariat à l'Energie Atomique et aux Energies Alternatives, Paris (FR)

(72) Inventors: Thomas-Medhi Benoist, Grenoble (FR); Haithem Ayari, Marseilles (FR); Bastien Giraud, Voreppe (FR); Adam Makosiej, Grenoble (FR); Yves Maneglia, Fontaine (FR); Santhosh Onkaraiah, Marseilles (FR); Jean-Michel Portal, Saint-Savournin (FR); Olivier Thomas, Revel (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/807,004

(22) Filed: Jul. 23, 2015

(65) Prior Publication Data
US 2016/0027509 A1    Jan. 28, 2016

(30) Foreign Application Priority Data

Jul. 25, 2014 (FR) ..................................... 14 57180

(51) Int. Cl.
 *G11C 5/06* (2006.01)
 *G11C 13/00* (2006.01)
(52) U.S. Cl.
 CPC ......... *G11C 13/0069* (2013.01); *G11C 13/003* (2013.01); *G11C 13/004* (2013.01); *G11C 13/0009* (2013.01); *G11C 2213/74* (2013.01); *G11C 2213/79* (2013.01)

(58) Field of Classification Search
 CPC ..... G11C 16/10; G11C 11/22; G11C 11/412; G11C 11/005; G11C 11/16; G11C 15/046; G11C 16/0408; G11C 16/0425; G11C 16/12; G11C 16/26; G11C 16/3459; G11C 17/12; G11C 2213/79
 USPC ................... 365/145, 149, 154, 156, 185.03, 365/185.18, 185.19, 203, 49.1, 49.17, 163, 365/185.11
 See application file for complete search history.

(56) References Cited

U.S. PATENT DOCUMENTS

| | | |
|---|---|---|
| 2010/0238711 A1 | 9/2010 | Asao |
| 2010/0238719 A1 | 9/2010 | Nebashi et al. |
| 2012/0075910 A1 | 3/2012 | Yasuda |
| 2014/0050009 A1 | 2/2014 | Abedifard et al. |
| 2015/0092479 A1* | 4/2015 | Dong ................... G11C 7/1075 365/158 |

OTHER PUBLICATIONS

French Search Report for Application No. FR1457180 issued Mar. 19, 2015, 2 pages.
European Search Report filed in 15306182.5, dated Dec. 7, 2015, 7 pgs.

* cited by examiner

*Primary Examiner* — Thong Q Le
(74) *Attorney, Agent, or Firm* — Moreno IP Law LLC

(57) ABSTRACT

A non-volatile memory including a plurality of elementary cells, each cell including: a first programmable-resistance storage element connected between first and second nodes of the cell; a first access transistor coupling the second node to a third node of the cell; and a second access transistor coupling the second node to a fourth node of the cell.

8 Claims, 5 Drawing Sheets

PROGRAMMABLE-RESISTANCE NON-VOLATILE MEMORY

BACKGROUND

The present disclosure generally relates to electronic circuits, and more specifically the field of programmable-resistance non-volatile memories, currently called resistive memories.

DISCUSSION OF THE RELATED ART

Resistive memories take advantage of the ability of certain materials to change electric resistivity, in reversible and non-volatile fashion, under the effect of a biasing. Conventionally, a resistive memory comprises an array of elementary storage cells, each comprising a storage element and one or a plurality of access transistors. The storage element is essentially formed of two conductive regions or electrodes, separated by a resistive programmable-resistance layer. The application of a properly-selected voltage between the two electrodes enables to modify the resistance of the resistive layer. Data can thus be recorded in the cells based on resistance values. As an example, each elementary storage cell is capable of storing one data bit. A storage element in a lightly-resistive state may for example correspond to binary value 1, and a storage element in a highly-resistive state may correspond to binary value 0. Existing resistive memories have various advantages, particularly problems of reliability over time, due to the fact that the voltage levels applied to program the elementary cells may be relatively high. It would be desirable to have a resistive memory overcoming all or part of these disadvantages.

SUMMARY

Thus, an embodiment provides a non-volatile memory comprising a plurality of elementary cells arranged in rows and in columns, each cell comprising: a first access transistor coupling first and second nodes of the cell; a second access transistor coupling the first node to a third node of the cell; and a single programmable-resistance storage element connected to the first node, this storage element coupling the first node to a fourth node of the cell, wherein, in each row, the cells have their fourth nodes connected by a first row-connection conductive track, and the gates of their first transistors connected by a second row-connection conductive track and wherein, in each column, the cells have their second nodes connected by a first column-connection conductive track, and their third nodes connected by a second column-connection conductive track, the memory further comprising a control circuit connected to the cells via the first and second row-connection conductive tracks and the first and second column-connection conductive tracks, this circuit being capable of: during a phase of programming a cell to a first state, applying a voltage of a first biasing across the storage element of the cell via the fourth and second nodes and the first transistor of the cell; and during a phase of programming the cell to a second state, applying a voltage having an opposite biasing across the storage element of the cell via the fourth and third nodes and the second transistor of the cell.

According to an embodiment, the control circuit is further capable, during a cell reading phase, of: precharging the second node of the cell to a first voltage; applying a second voltage different from the first voltage to the source node of the cell; controlling the first transistor to the on state; and then measuring a variation of the voltage of the second node relative to the first voltage.

According to an embodiment, in each cell, the gate of the second transistor is connected to a node of application of a fixed voltage.

According to an embodiment, in each cell, the first and second transistors are MOS transistors of opposite conductivity types.

According to an embodiment, in each cell: the difference between the voltage applied to the first node during the phase of cell programming to the first state and the voltage applied to the first node during the phase of cell programming to the second state is greater than the maximum gate-source or gate-drain voltage that the first and second transistors can withstand without being damaged; and the voltages applied to the gates of the first and second transistors during phases of cell programming to the first and second states having an intermediate level between the voltage applied to the first node during the phase of cell programming to the first state and the voltage applied to the first node during the phase of cell programming to the second state.

According to an embodiment, in each cell, the first transistor is an N-channel MOS transistor, and the second transistor is a P-channel MOS transistor.

According to an embodiment, each cell further comprises: a third access transistor coupling a fifth node to a sixth node of the cell; a fourth access transistor connecting the fifth node to the third node of the cell; and a single programmable-resistance storage element connected to the fifth node, the storage element coupling the fifth node to the fourth node of the cell.

According to an embodiment, in each cell, the gate of the third transistor is connected to the gate of the first transistor, and the gate of the fourth transistor is connected to the gate of the second transistor.

According to an embodiment, in each cell, the first and third transistors are of the same conductivity type, and the second and fourth transistors are of the same conductivity type.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
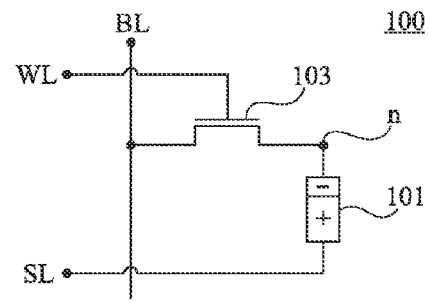
FIG. 1 is an electric diagram illustrating an example of an elementary cell of a resistive memory.

For clarity, the same elements have been designated with the same reference numerals in the various drawings and, further, the various drawings are not to scale. Further, in the following description, unless otherwise indicated, terms "approximately", "substantially", "about", "almost", and "in the order of" mean "to within 20%".

FIG. 1 is an electric diagram illustrating an example of an elementary cell 100 of a resistive memory. Cell 100 comprises a programmable-resistance storage element 101. Storage element 101 for example comprises two conductive regions or electrodes, separated by a programmable-resistance layer. Cell 100 further comprises an access transistor 103, an N-channel MOS transistor in the shown example, series-connected with storage element 101 between nodes BL and SL of the cell. In this example, the electrodes of storage element 101 are respectively connected to node SL and to an intermediate node n of the cell, and the conduction nodes (source, drain) of transistor 103 are respectively connected to node n and to node BL of the cell. Each cell further comprises a node WL connected to the gate of transistor 103. It should be noted that storage element 101 is an asymmetrical dipole, that is, its behavior depends on the biasing of the voltage applied between its electrodes. Indeed, the programming of element 101 to a lightly-resistive state is obtained by application of a programming voltage of given biasing between its electrodes, while the programming of element 101 to a highly-resistive state is obtained by application of a programming voltage of opposite biasing between its electrodes. In this example, storage element 101 of cell 100 is considered to be connected in such a way that the programming of element 101 to a lightly-resistive state is obtained by application of a positive voltage between nodes SL and n of the cell, and that the programming of element 101 to a highly-resistive state is obtained by application of a negative voltage between nodes SL and n of the cell.

Figure 2:
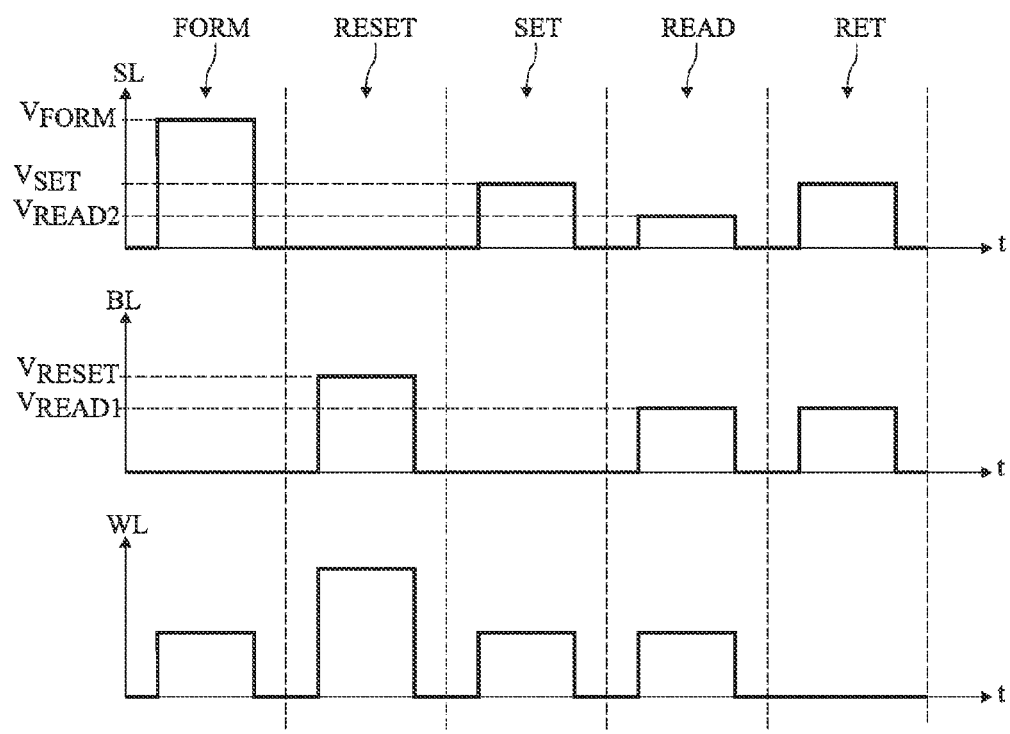
FIG. 2 is a timing diagram illustrating an example of a method of controlling a memory cell of the type described in relation with FIG. 1.

FIG. 2 is a timing diagram illustrating an example of a method of controlling cell 100 of FIG. 1. More specifically, FIG. 2 illustrates the time variation of the voltages applied to nodes SL, BL, and WL of cell 100 during different cell control phases.

During the first use of cell 100 after manufacturing, storage element 101 of the cell is in a highly-resistive state and should be initialized. To achieve this, a relatively high voltage may be applied between nodes SL and n of the cell, to create a conductive or lightly resistive path in the resistive layer of storage element 103. As will be discussed in further detail hereafter, this path can be then "deleted" and then "recreated" a large number of times by application of respective negative and positive programming voltages, of lower amplitude than the initialization voltage, during steps of writing into the cell.

In this example, during a phase of initialization (FORM) of cell 100, node BL is set to a reference or ground voltage, for example, 0 V, and node SL is set to a positive voltage $V_{FORM}$ (that is, greater than the reference voltage). Voltage $V_{FORM}$ is for example greater than a high power supply voltage $V_{DD}$ of the chip containing the memory. As an example, voltage $V_{FORM}$ is in the order of $2*V_{DD}$, voltage $V_{DD}$ for example being a high power supply voltage capable of powering integrated circuits manufactured in CMOS technology comprising transistors having dimensions identical or similar to those of transistor 103, for example, a voltage in the order of 1.2 V. During the initialization phase, access transistor 103 of the cell is turned on by application of positive voltage smaller than voltage $V_{FORM}$, for example, in the order of $V_{DD}$, to node WL.

At the end of the initialization phase, storage element 101 of cell 100 is in a so-called lightly-resistive state. Element 101 may be reprogrammed to a more highly resistive state. To achieve this, a negative programming voltage may be applied between nodes SL and n of cell 100, which suppresses the lightly-resistive path previously formed in the resistive layer of element 101.

In this example, in a phase (RESET) of reprogramming cell 100 to a highly-resistive state, node SL is grounded, node BL is set to a positive voltage $V_{RESET}$ lower than voltage $V_{FORM}$, for example, in the order of $1.5*V_{DD}$, and access transistor 103 of the cell is turned on by application of a positive voltage greater than voltage $V_{RESET}$ to node WL, for example, a voltage in the order of $2*V_{DD}$. The voltages are selected so that transistor 103 conducts a sufficient current to enable storage element 101 to switch state.

After a step (RESET) of reprogramming cell 100 to a highly-resistive state, storage element 101 of the cell may again be reprogrammed to a lightly-resistive state. To achieve this, a positive reprogramming voltage may be applied between nodes SL and n of cell 100, so that a lightly-resistive path forms again in the resistive layer of element 101.

In this example, in a phase (SET) of reprogramming cell 100 to a lightly-resistive state, node BL is grounded, node SL is set to a positive voltage $V_{SET}$ lower than voltage $V_{RESET}$, for example, in the order of $V_{DD}$, and access transistor 103 of the cell is turned on by application of a positive voltage, for example, in the order of $V_{DD}$, to node WL.

Reading the value stored in cell 100 amounts to determining whether storage element 101 of the cell is in a lightly-resistive state or in a highly-resistive state.

In this example, during a phase (READ) of reading cell 100, node BL is precharged to a positive voltage $V_{READ1}$, for example, in the order of $V_{DD}$, and then left floating, and node SL is set to a voltage $V_{READ2}$ lower than voltage $V_{READ1}$, for example, to a voltage in the order of $V_{DD}/2$. Access transistor 103 of the cell is then turned on by application of a positive voltage, for example, in the order of $V_{DD}$, to node WL. After a discharge time during which access transistor 103 is in the on state, the voltage of node BL is compared with a reference voltage by a read circuit, not shown. If the voltage of node BL is higher than the reference voltage, the cell is considered as being in a highly-resistive state, and if the voltage of node BL is lower than the reference voltage, the cell is considered as being in a lightly-resistive state.

In this example, during stand-by or data retention phases (RET), that is, when the memory is powered but no initialization, write, or read operation is performed in the cell, nodes BL and SL are set to a same voltage, for example, a positive voltage in the order of $V_{DD}$, and transistor 103 is turned off by the application of an adapted voltage, for example, 0 V, to node WL.

A disadvantage of memory cell 100 described in relation with FIGS. 1 and 2 particularly relates to the voltage levels to be applied to program the cell to a lightly-resistive state (FORM and SET) or to a highly-resistive state (RESET). In particular, during RESET phases, a relatively high voltage $V_{RESET}$ (greater than voltage $V_{DD}$) is applied to node BL, and a still higher voltage is applied to node WL to turn on transistor 103. This results in a certain complexity of the memory control circuits to apply adapted voltage levels to nodes BL and WL of the cells. Further, the gate oxide of transistor 103 may be submitted to relatively high voltages (higher than $V_{DD}$), which may relatively rapidly damage this transistor.

Figure 3:
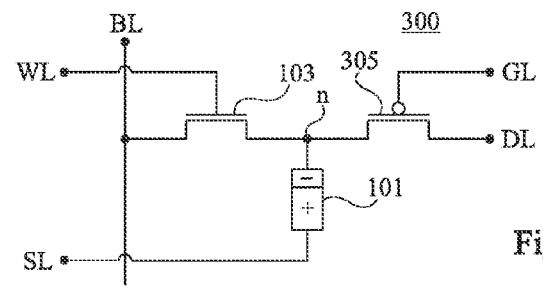
FIG. 3 is an electric diagram illustrating an embodiment of an elementary cell of a resistive memory.

FIG. 3 is an electric diagram illustrating an embodiment of an elementary cell 300 of a resistive memory. In this example, cell 300 comprises the same elements as cell 100 of FIG. 1, substantially arranged in the same way, and further comprises a second access transistor 305, a P-channel MOS transistor in the shown example, coupling node n to an additional node DL of the cell, not connected to node BL. The gate of transistor 305 is connected to an additional node GL of the cell, not connected to node WL. Thus, in cell 300, a single programmable-resistance storage element (element 101) is connected to a node (node n) common to two series-connected access transistors (transistors 103 and 305), the storage element coupling common node n to another node (node SL) of the cell. It should be noted that single storage element here means that the cell does not comprise another programmable-resistance storage element coupling node n to a cell node different from node SL. However, storage element 101 may be formed of a plurality of identical or similar storage elements of same biasing, connected in parallel between node n and node SL.

Figure 4:
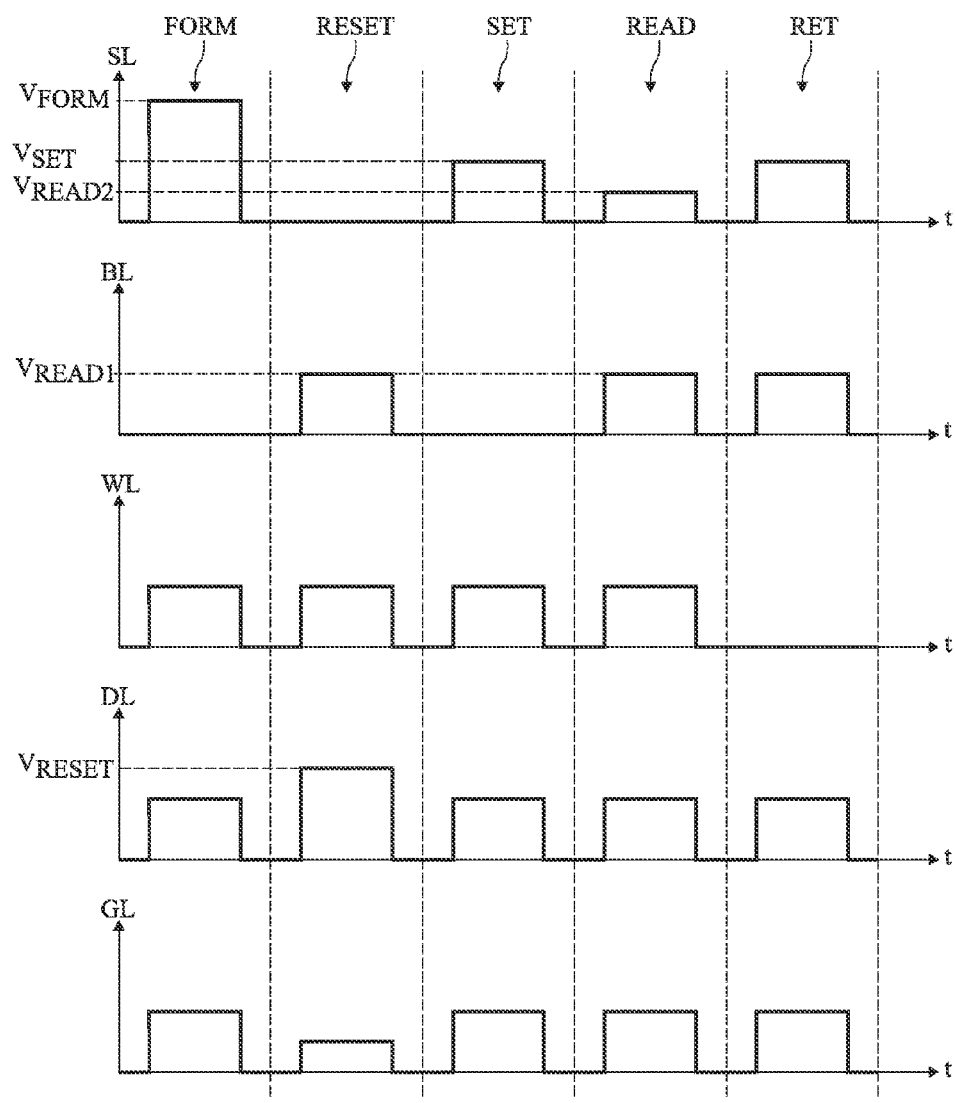
FIG. 4 is a timing diagram illustrating an example of a method of controlling a memory cell of the type described in relation with FIG. 3.

FIG. 4 is a timing diagram illustrating an example of a method of controlling cell 300 of FIG. 3. More specifically, FIG. 4 illustrates the time variation of the voltages applied to nodes SL, BL, WL, DL, and GL of cell 300 during different cell control phases.

During a phase of initialization (FORM) of cell 300, node BL is set to a reference voltage or ground, for example, 0 V, node SL is set to a positive voltage $V_{FORM}$, for example, higher than $V_{DD}$, for example, in the order of $2*V_{DD}$, and access transistor 103 of the cell is turned on by application of a positive voltage lower than voltage $V_{FORM}$, for example, in the order of $V_{DD}$, to node WL. During the initialization phase, transistor 305 is maintained off. To achieve this, in this example, nodes GL and DL are both set to a same positive voltage, for example, in the order of $V_{DD}$.

During a phase (RESET) of reprogramming cell 300 to a highly-resistive state, node SL is grounded, node DL is set to a positive voltage $V_{RESET}$, for example, higher than $V_{DD}$, for example, in the order of $1.5*V_{DD}$, and access transistor 305 of the cell is turned on by application of a positive voltage lower than voltage $V_{RESET}$, for example, a voltage in the order of $V_{DD}/2$, to node GL. During the phase of reprogramming the cell to a highly-resistive state, transistor 103 is maintained off. To achieve this, nodes BL and WL are both set to a same positive voltage, for example, in the order of $V_{DD}$.

During a phase (SET) of reprogramming cell 300 to a lightly-resistive state, node BL is grounded, node SL is set to a positive voltage $V_{SET}$, for example, in the order of $V_{DD}$, and access transistor 103 of the cell is turned on by application of a positive voltage, for example, in the order of $V_{DD}$, to node WL. During this step, transistor 305 is maintained off. To achieve this, in this example, nodes DL and GL are set to a same positive voltage, for example, in the order of $V_{DD}$.

During a phase (READ) of reading cell 300, node BL is precharged to a positive voltage $V_{READ1}$, for example, in the order of $V_{DD}$, and then left floating, and node SL is set to a voltage $V_{READ2}$ lower than voltage $V_{READ1}$, for example, to a voltage in the order of $V_{DD}/2$. Access transistor 103 of the cell is then turned on by application of a positive voltage, for example, in the order of $V_{DD}$, to node WL. After a discharge time during which access transistor 103 is in the on state, the voltage of node BL is compared with a reference voltage by a read circuit, not shown. In this example, during the read phase, transistor 305 is maintained off. To achieve this, nodes DL and GL are set to a same positive voltage, for example, in the order of $V_{DD}$.

In this example, during stand-by or data retention phases (RET), that is, when the memory is powered but no initialization, write, or read operation is performed in the cell, nodes BL, SL, and DL are set to a same voltage, for example, a positive voltage in the order of $V_{DD}$, and transistors 103 and 305 are turned off by the application of adapted voltages to nodes WL and GL, for example, a 0 V voltage to node WL and a voltage in the order of $V_{DD}$ to node GL.

An advantage of memory cell 300 lies in the fact that it comprises two different nodes BL and DL both enabling to apply control voltages to node n, via transistor 103 for node BL and via transistor 305 for node DL. This enables to simplify the cell control circuits. In particular, it may for example be chosen to use node BL and transistor 103 to apply positive voltages between nodes SL and n (during FORM and SET phases in this example), and to use node DL and transistor 305 to apply negative voltages between nodes SL and n (during RESET and READ phases in this example). This further enables to improve the reliability of the cell and to extend the lifetime thereof. Indeed, the provision of transistor 305 and of additional node DL enables to implement control modes where the gate oxides of transistors 103 and 305 are only submitted to relatively low voltages, typically smaller than $V_{DD}$, which is not possible with a cell of the type described in relation with FIG. 1. This is particularly verified in the case shown in FIG. 3 where transistors 103 and 305 are of opposite conductivity types. One may in particular, when transistors 103 and 305 are of opposite conductivity types, control the cell so that:

the difference between the voltage applied to node n during the phase of programming the cell to the highly-resistive state and the voltage applied to node n during the phase of programming the cell to the lightly-resistive state is greater than the maximum gate-source or gate-drain voltage that transistors 103 and 305 can withstand without being damaged (for example, voltage $V_{DD}$); and the voltages applied to the gates of transistors 103 and 305 during phases of programming the cell to the highly-resistive state and to the lightly-resistive state have intermediate levels between the voltage applied to node n during the phase of programming the phase to the highly-resistive state and the voltage applied to node n during the phase of programming the cell to the lightly-resistive state.

More particularly, the voltages applied to the gates of transistors 103 and 305 during phases of programming the cell to the highly-resistive state and to the lightly-resistive state may be selected so that transistors 103 and 305 never see gate-source or gate-drain voltages greater than the maximum gate-source or gate-drain voltage that the transistors can withstand without being damaged. This enables to increase the reliability and the lifetime of the access transistors with respect to a cell of the type described in relation with FIG. 1.

Further, the sizing of each of transistors 103 and 305 may be specifically adapted to the operations for which this transistor is intended to be used. In particular, transistors 103 and 305 may have different channel widths. This for example enables to obtain, from identical voltage levels, current levels in the storage element different according to whether the current flows through transistor 103 or through transistor 305.

It should be noted that although an embodiment where transistors 103 and 305 have opposite conductivity types has been shown in FIG. 3, the described embodiments are not limited to this specific case. As a variation, transistor 305 may be of the same conductivity type as transistor 103, for example, with an N channel.

When transistors 103 and 305 are of the same conductivity type, it is particularly advantageous for the transistors to be sized differently. Indeed, for certain types of programmable-resistance storage elements, it may in practice be necessary, to avoid damaging the storage element, for the current applied to the storage element during phases of programming to the lightly-resistive state (SET) to be lower than the current applied to the storage element during phases of programming to the highly-resistive state (RESET). In a conventional cell of the type described in relation with FIG. 1, this makes the control of transistor 103 relatively complex. In a cell of the type described in relation with FIG. 3, the control of the current applied to the storage element may be obtained by an adapted sizing of transistors 103 and 305. As an example, transistors 103 and 305 may be sized so that, for a same control voltage applied to their respective gates, the current flowing through transistor 103 is lower than the current flowing through transistor 305. Transistor 103 can then be used to program storage element 101 to the lightly-resistive state (SET), and transistor 305 may be used to program storage element 101 to the highly-resistive state (RESET). As a variation, transistors 103 and 305 may both be used to program storage element 101 to the lightly-resistive state, but with different resistance values (which enables to store more than one data bit per storage element). For example, transistor 305 may be used to program element 101 to the highly-resistive state (RESET) and to program element 101 to a first lightly resistive state (SET1), and transistor 103 may be used to program element 101 to a second lightly resistive state (SET2), more highly resistive than the first state.

Figure 5:
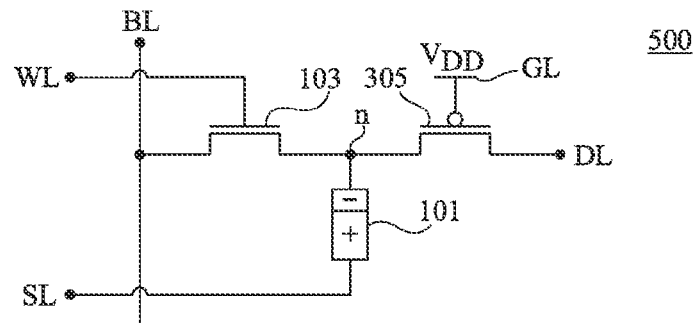
FIG. 5 is an electric diagram illustrating an alternative embodiment of an elementary cell of a resistive memory.

FIG. 5 is an electric diagram illustrating an alternative embodiment of cell 300 of FIG. 3. Cell 500 of FIG. 5 differs from cell 300 in that, in the example of FIG. 5, node GL is connected to a node or rail of application of a fixed or constant voltage $V_C$, equal to voltage $V_{DD}$ in this example. In the example of FIG. 5, the signal applied to node DL is transmitted or blocked by transistor 305 according to its value. In particular, transistor 305 is on when the voltage of node DL is greater than $V_C$+VT, where VT designates the threshold voltage of transistor 305, and off when the voltage of node DL is lower than $V_C$+VT. An advantage of this alternative embodiment is that cell 500 comprises one less control node than in the example of FIG. 3, which simplifies the forming of the memory control circuits.

Cell 500 of FIG. 5 may for example be controlled according to a method similar to that described in relation with FIG. 4. As an example, the method of controlling cell 500 differs from the method of FIG. 4 only by the control mode of transistor 305. In particular, during phases of cell initialization (FORM), of reprogramming the cell to a lightly-resistive state (SET), of reading (READ), and of stand-by (RET), transistor 305 may be maintained off by applying to node DL a positive voltage lower than $V_C$+VT, for example, a voltage in the order of $V_{DD}$. During phases of reprogramming the cell to a highly-resistive state (RESET), transistor 305 may be turned on by applying to node DL a positive voltage higher than $V_C$+VT, for example, a voltage in the order of 1.5*$V_{DD}$.

In the case where transistor 305 is an N-channel transistor, fixed voltage $V_C$ applied to the gate of transistor 305 is for example equal to the ground voltage, for example, 0 V.

Figure 6:
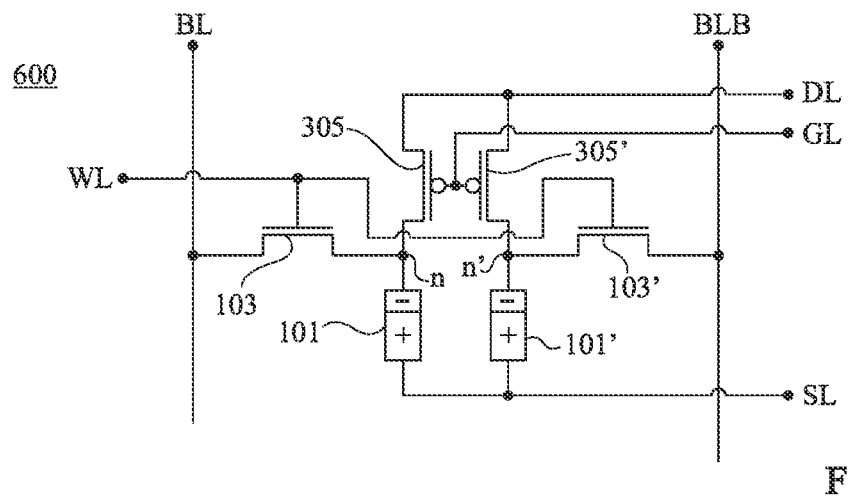
FIG. 6 is an electric diagram illustrating another alternative embodiment of an elementary cell of a resistive memory.

FIG. 6 is an electric diagram illustrating a differential alternative embodiment of cell 300 of FIG. 3. Cell 600 of FIG. 6 comprises the same elements as cell 300 of FIG. 3, connected substantially in the same way, and further comprises a second programmable-resistive storage element 101', for example, identical or similar to element 101, and third and fourth access transistors 103' and 305', for example, respectively identical or similar to transistors 103 and 305. Transistor 103' is series-connected with storage element 101' between a node BLB of cell 600 (not connected to nodes BL and DL) and node SL. In this example, the electrodes of storage element 101' are respectively connected to node SL and to an intermediate node n' (not connected to node n) of cell 600, and the conduction nodes (source, drain) of transistor 103' are respectively connected to node n' and to node BLB. The gate of transistor 103' is connected to node WL. The conductive electrodes of transistor 305' are respectively connected to node n' and to node DL. The gate of transistor 305' is connected to node GL. Thus, in cell 600, a single programmable-resistance storage element (element 101') is connected to a node (node n') common to two series-connected access transistors (transistors 103' and 305'), the storage element coupling common node n' to another node (node SL) of the cell. It should be noted that single storage element here means that the cell does not comprise another programmable-resistance storage element coupling node n' to a cell node different from node SL. However, storage element 101' may be formed of a plurality of identical or similar storage elements having the same biasing, connected in parallel between node n' and node SL. In this example, storage element 101' of cell 600 is considered to be connected in such a way that the programming of element 101' to a lightly-resistive state is obtained by application of a positive voltage between nodes SL and n' of the cell, and that the programming of element 101' to a highly-resistive state is obtained by application of a negative voltage between nodes SL and n' of the cell.

Cell 600 is capable of differentially storing a piece of data, that is when storage element 101 is programmed to a highly-resistive state, storage element 101' is programmed to a lightly-resistive state, and when storage element 101 is programmed to a lightly-resistive state, storage element 101' is programmed to a highly-resistive state. This enables to more easily and more reliably read the value stored in the cell.

As an example, during a phase of initialization (FORM) of cell 600, nodes BL and BLB are both grounded, node SL is set to voltage $V_{FORM}$, and transistors 103 and 103' of the cell are both turned on by application of an adapted voltage (for example, in the order of $V_{DD}$) to node WL. During the initialization phase, transistors 305 and 305' may be maintained off, for example, by applying a same positive voltage (for example, in the order of $V_{DD}$) to nodes GL and DL.

During a phase (RESET) of reprogramming cell 600 to a highly-resistive state, node SL may be grounded, node DL may be set to positive voltage $V_{RESET}$, and access transistors 305 and 305' of the cell may be turned on by application of a positive voltage lower than voltage $V_{RESET}$ to node GL (for example, a voltage in the order of $V_{DD}/2$). During the phase of reprogramming the cell to a highly-resistive state, transistors 103 and 103' may be maintained off, for example, by application of a same positive voltage to nodes BL, BLB, and WL, for example, a voltage in the order of $V_{DD}$.

During a phase (SET) of reprogramming cell 600 to a lightly-resistive state, nodes BL and BLB may be grounded, node SL may be set to positive voltage $V_{SET}$, and access transistors 103 and 103' of the cell may be turned by application of a positive voltage (for example, in the order of $V_{DD}$) to node WL. During this step, transistors 305 and 305' may be maintained off, for example, by application of a same positive voltage (for example, in the order of $V_{DD}$) to nodes DL and GL.

To differentially write a piece of data into cell 600, it may first be provided to reprogram the cell to a highly-resistive state as indicated hereabove (RESET phase). Node SL may then be set to positive voltage $V_{SET}$, and one of nodes BL and BLB may be grounded and the other may be set to voltage $V_{SET}$. Transistors 103 and 103' may then be turned on by application of a positive voltage, for example, in the order of $V_{DD}$, to node WL. If node BL is grounded and node BLB is at voltage $V_{SET}$, storage element 101 will switch to the lightly-resistive state and storage element 101' will remain in the highly-resistive state. Conversely, if node BLB is grounded and node BL is at voltage $V_{SET}$, storage element 101' will switch to the lightly-resistive state and storage element 101 will remain in the highly-resistive state. During this step, transistors 305 and 305' may be maintained off, for example, by application of a same positive voltage (for example, in the order of $V_{DD}$) to nodes DL and GL.

During a phase (READ) of reading a piece of data differentially stored in cell 600, nodes BL and BLB may be precharged to a same positive voltage $V_{READ1}$ (for example, in the order of $V_{DD}$) and then left floating, and node SL may be set to a voltage $V_{READ2}$ lower than voltage $V_{READ1}$ (for example, a voltage in the order of $V_{DD}/2$). Access transistors 103 and 103' of the cell are then turned on by application of a positive voltage, for example, in the order of $V_{DD}$, to node WL. After a discharge time during which transistors 103 and 103' are in the on state, a read circuit, not shown, determines whether the voltage between nodes BL and BLB is positive or negative, which enables to know the value stored in the cell. In this example, during the read phase, transistors 305 and 305' may be maintained off, for example, by application of a positive voltage (for example, in the order of $V_{DD}$) to node GL.

During stand-by or data retention phases (RET), that is, when the memory is powered but no set, write, or read operation is performed in the cell, nodes BL, BLB, SL, and DL are set to a same voltage, for example, a positive voltage (for example, in the order of $V_{DD}$) and transistors 103, 103', 305, and 305' may be turned off by the application of adapted voltages to nodes WL and GL.

As a variation, in the example of FIG. 6, node GL may, as in the example of FIG. 5, be connected to a node of application of a constant high power supply voltage, for example, voltage $V_{DD}$. In this case, the control of transistors 305 and 305' is performed via node DL, similarly to what has been described in relation with FIG. 5.

Figure 7:
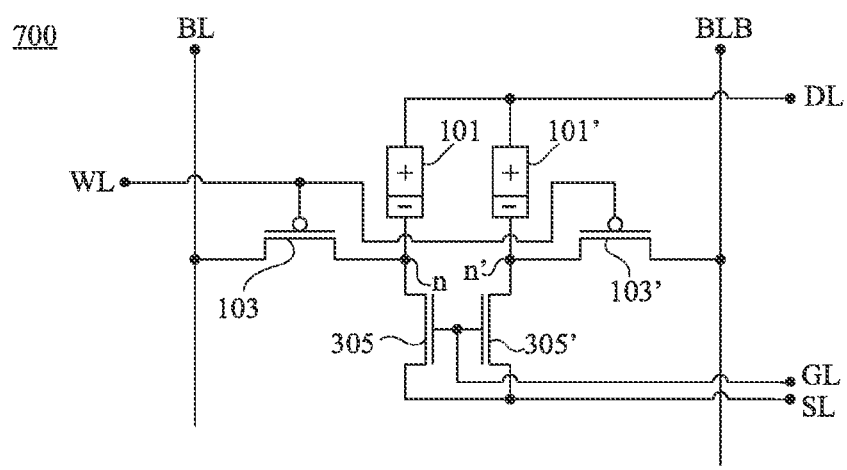
FIG. 7 is an electric diagram illustrating another alternative embodiment of an elementary cell of a resistive memory.

FIG. 7 is an electric diagram illustrating an alternative embodiment of a differential memory cell. Cell 700 of FIG. 7 substantially corresponds to the complementary of cell 600 of FIG. 6. In cell 700 of FIG. 7, element 101 is connected between nodes n and DL so that the programming of element 101 to a lightly-resistive state is obtained by application of a positive voltage between nodes DL and n, and that the programming of element 101 to a highly-resistive state is obtained by application of a negative voltage between nodes DL and n. Further in this example, element 101' is connected between nodes n' and DL so that the programming of element 101' to a lightly-resistive state is obtained by application of a positive voltage between nodes DL and n', and that the programming of element 101' to a highly-resistive state is obtained by application of a negative voltage between nodes DL and n'. In this example, transistors 103 and 103' are P-channel MOS transistors, and are respectively connected between nodes n and BL and between nodes n' and BLB. The gates of transistors 103 and 103' are connected to node WL. In this example, transistors 305 and 305' are N-channel MOS transistors, and are respectively connected between nodes n and SL and between nodes n' and SL. The gates of transistors 305 and 305' are connected to node GL.

Figure 8:
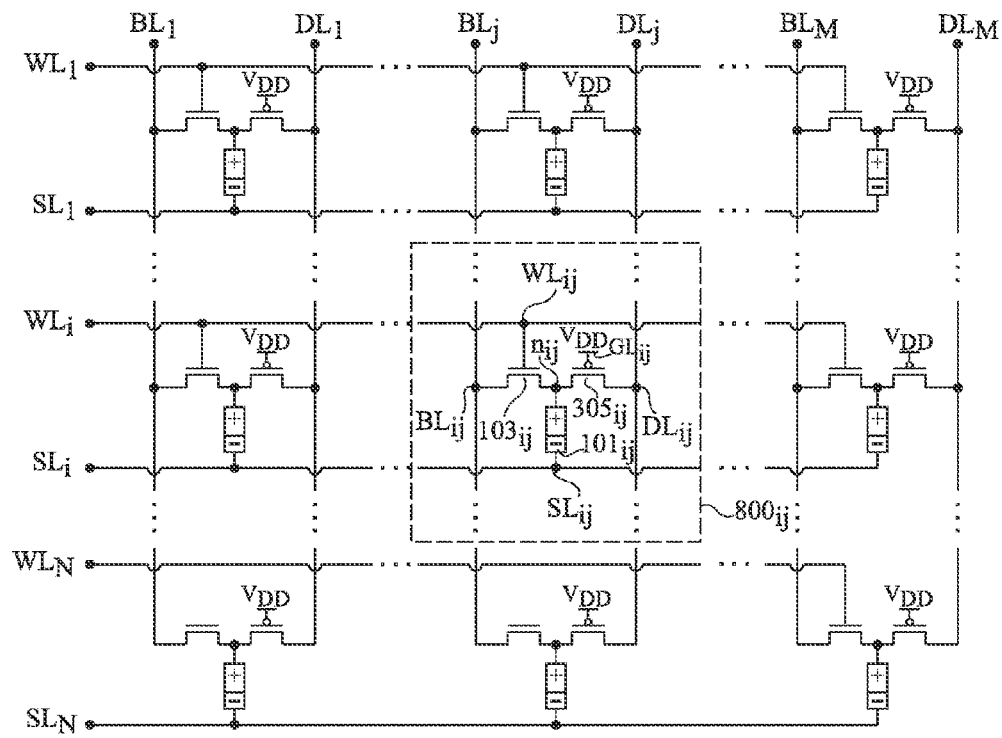
FIG. 8 is an electric diagram illustrating an embodiment of a resistive memory.

FIG. 8 is an electric diagram illustrating an embodiment of a resistive memory. The memory of FIG. 8 comprises an array of identical or similar N*M memory cells $800_{ij}$ arranged in N rows and M columns, N and M being integers greater than 1, i being an integer from 1 to N (row index), and j being an integer from 1 to M (column index). In this example, each cell $800_{ij}$ comprises a programmable-resistance storage element $101_{ij}$, connected between nodes $SL_{ij}$ and $n_{ij}$ of the cell. In this example, element $101_{ij}$ is connected in such a way that the programming of element $101_{ij}$ to a lightly-resistive state is obtained by application of a negative voltage between nodes $SL_{ij}$ and $n_{ij}$, and that the programming of element $101_{ij}$ to a highly-resistive state is obtained by application of a positive voltage between nodes $SL_{ij}$ and $n_{ij}$. Each cell $800_{ij}$ further comprises a MOS transistor $103_{ij}$, an N-channel transistor in the shown example, connected between node $n_{ij}$ and a node $BL_{ij}$ of the cell. The gate of transistor $103_{ij}$ is connected to a node $WL_{ij}$ of the cell. Each cell $800_{ij}$ further comprises a MOS transistor $305_{ij}$, a P-channel transistor in this example, connected between node $n_{ij}$ and a node $DL_{ij}$ of the cell different from node $BL_{ij}$. The gate of transistor $305_{ij}$ is connected to a node $GL_{ij}$ of the cell. In this example, in each elementary cell $800_{ij}$, node $GL_{ij}$ of the cell is connected to a node of application of a constant high power supply voltage, voltage $V_{DD}$ in the shown example.

In this example, the initialization (FORM) of a cell $800_{ij}$ may be performed via transistor $305_{ij}$, by setting nodes $SL_{ij}$ and $DL_{ij}$ of the cell respectively to ground and to voltage $V_{FORM}$ ($V_{FORM}$ being greater than $V_{DD}$+VT to cause the turning-on of transistor $305_{ij}$). The reprogramming of the cell to a highly-resistive state (RESET) may be performed via transistor $103_{ij}$, by setting nodes $SL_{ij}$ and $BL_{ij}$ respectively to voltage $V_{RESET}$ and to ground, and by setting node $WL_{ij}$ to a voltage for controlling the turning-on of transistor $103_{ij}$. The reprogramming of the cell to a lightly-resistive state (SET) may be performed via transistor $305_{ij}$, by setting nodes $SL_{ij}$ and $DL_{ij}$ of the cell respectively to ground and to voltage $V_{SET}$ ($V_{SET}$ being greater than $V_{DD}$+VT to cause the turning-on of transistor $305_{ij}$). The reading (READ) of the cell may be performed via transistor $103_{ij}$, by setting nodes $SL_{ij}$ and $BL_{ij}$ respectively to voltage $V_{READ1}$ and to voltage $V_{READ2}$, and by setting node $WL_{ij}$ to a voltage for controlling the turning-on of transistor $103_{ij}$.

In this example, nodes $BL_{ij}$ of cells $800_{ij}$ of a same column of rank j of the array are connected by a conductive track $BL_j$, nodes $DL_{ij}$ of cells $800_{ij}$ of a same column of rank j of the array are connected by a conductive track $DL_j$, nodes $WL_{ij}$ of cells $800_{ij}$ of a same row of rank i of the array are connected by a conductive track $WL_i$, and nodes $SL_{ij}$ of cells $800_{ij}$ of a same row of rank i of the array are connected by a conductive track $SL_i$.

The FORM and SET phases may be carried out according to three types of granularity, that is, by cell, by group of a plurality of cells of a same row of the array, or by group of a plurality of cells located at the intersections of an assembly of a plurality of rows and of a plurality of columns of the array.

As an example, to individually initialize (FORM) a cell $800_{ij}$, track $SL_i$ may be grounded, the other tracks SL may be set to voltage $V_{FORM}$, track $DL_j$ may be set to voltage $V_{FORM}$, and the other tracks DL may be set to a voltage enabling to turn off the corresponding MOS transistors 305, for example, voltage $V_{DD}$. During this operation, the transistors 103 of all the cells of the array may be maintained off, for example, by application of a same positive voltage (for example, voltage $V_{DD}$) to all tracks BL and WL of the memory. The reprogramming (SET) of the cell to a lightly-resistive state may be carried out similarly, by replacing voltage $V_{FORM}$ with voltage $V_{SET}$.

To simultaneously initialize (FORM) or reprogram to a lightly-resistive state (SET) a plurality of cells of a same row of rank i of the memory, track $SL_i$ may be grounded, the other tracks SL may be set to positive voltage $V_{FORM}$ or $V_{SET}$ (according to the operation which is desired to be performed), tracks DL of the columns which are desired to be activated may be set to positive voltage $V_{FORM}$ or $V_{SET}$, and the other tracks DL may be set to a voltage enabling to turn off the corresponding MOS transistors 305, for example, to voltage $V_{DD}$.

To simultaneously initialize (FORM) or reprogram to a lightly-resistive state (SET) the cells located at the intersections of an assembly of a plurality of rows and a plurality of columns of the memory, track SL of the rows to be activated may be grounded, and the other tracks SL may be set to positive voltage $V_{FORM}$ or $V_{SET}$ (according to the operation which is desired to be performed, tracks DL of the columns to be activated may be set to voltage $V_{FORM}$ or $V_{SET}$, and the other tracks DL may be set to a voltage enabling to turn off the corresponding MOS transistors 305, for example, voltage $V_{DD}$.

The RESET phases may be carried out according to the three above-mentioned types of granularity, that is, by cell, by group of a plurality of cells of a same row, or by group of a plurality of cells located at the intersections of an assembly of a plurality of rows and of an assembly of a plurality of columns.

As an example, to individually reprogram a cell $800_{ij}$ to a highly-resistive state (RESET), track $SL_i$ may be set to positive voltage $V_{RESET}$, track $BL_j$ may be grounded, and track $WL_i$ may be set to a voltage for controlling transistor $103_{ij}$ to the on state, for example, voltage $V_{DD}$. The other tracks SL may be grounded, and the other tracks BL and WL may be set to a same positive voltage, for example voltage $V_{DD}$, to turn off the corresponding transistors 103. During this operation, transistors 305 of all the cells in the array may be maintained off, for example, by application of a positive voltage in the order of $V_{DD}$ to all tracks DL of the memory.

To simultaneously reprogram to a highly-resistive state (RESET) a plurality of cells of a same row of rank i of the memory, track $SL_i$ may be set to voltage $V_{RESET}$, tracks BL of the columns to be activated may be grounded, and track $WL_i$ may be set to a voltage for controlling transistor $103_{ij}$ to the on state, for example, voltage $V_{DD}$. The other tracks SL may be grounded, and the other tracks BL and WL may be set to a same positive voltage, for example voltage $V_{DD}$, to turn off the corresponding transistors 103. Transistors 305 of all the cells of the array may be maintained off, for example, by application of a positive voltage in the order of $V_{DD}$ to all tracks DL of the memory.

To simultaneously reprogram to a highly-resistive state (RESET) the cells located at the intersections of an assembly of a plurality of rows and a plurality of columns of the memory, tracks SL of the rows to be activated may be set to voltage $V_{RESET}$, tracks BL of the columns to be activated may be grounded, and tracks WL of the rows to be activated may be set to a voltage for controlling the corresponding transistors 103 to the on state, for example, to voltage $V_{DD}$. The other tracks SL may be grounded, and the other tracks BL and WL may be set to a same positive voltage, for example voltage $V_{DD}$, to turn off the corresponding transistors 103. Transistors 305 of all the cells in the array may be maintained off, for example, by application of a positive voltage in the order of $V_{DD}$ to all tracks DL of the memory.

The read phases (READ) may be carried out according to two types of granularity, that is, by cell, or by group of a plurality of cells of a same line, with polarization directions identical to those of the phases of reprogramming to a highly-resistive state (RESET).

Figure 9:
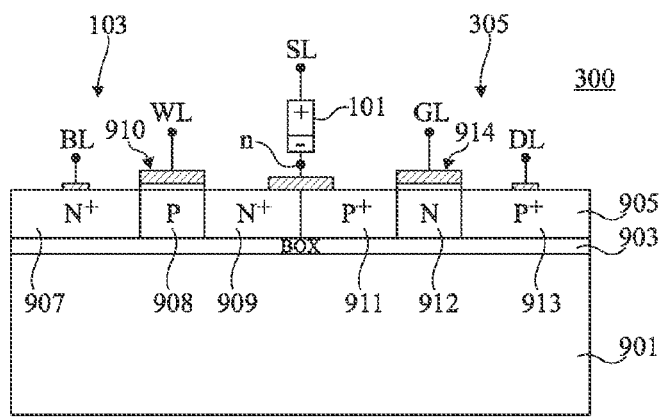
FIG. 9 is a cross-section view schematically illustrating an embodiment of an elementary cell of a resistive memory.

FIG. 9 is a cross-section view schematically illustrating an embodiment of a memory cell 300 of the type described in relation with FIG. 3. In this example, cell 300 is made inside and on top of a substrate of semiconductor-on-insulator type (SOI), comprising a stack of a semiconductor support 901, for example, made of silicon, of an insulating layer 903 (BOX), for example, made of silicon oxide, and of a semiconductor layer 905, for example, made of silicon. Transistors 103 and 305 are formed inside and on top of semiconductor layer 905. More specifically, transistor 103 comprises two N-type doped regions 907 and 909 ($N^+$), separated by a P-type doped region 908, regions 907, 908, and 909 being formed in layer 905, and region 908 being topped with a gate stack 910. Transistor 305 comprises two P-type doped regions 911 and 913 ($P^+$), separated by an N-type doped region 912, regions 911, 912, and 913 being formed in layer 903, and region 912 being topped with a gate stack 914. In this example, regions 909 and 911 are juxtaposed and coupled by a metallization formed on their upper surface side (that is, opposite to layer 905), connecting region 909 and 911 to node n of the cell. A metallization formed on the upper surface side of region 907 connects region 907 to node BL of the cell, and a metallization formed on the upper surface side of region 913 connects region 913 to node DL of the cell. Gates 910 and 914 are respectively connected to node WL and to node GL. The programmable-resistance storage element 101 is formed in the upper layers (not shown) of the structure, between node n and node SL.

The structure of FIG. 9 has the advantage of being particularly compact, particularly due to the juxtaposition of transistors 103 and 305 and to the arrangement of storage element 101 in the space located above transistors 103 and 305. The described embodiments are however not limited to this specific configuration.

Figure 10:
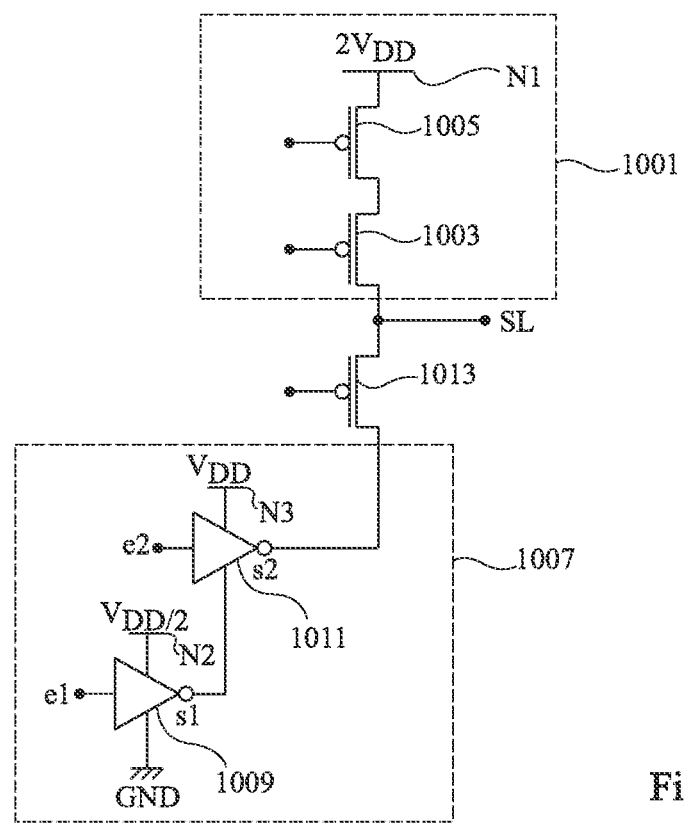
FIG. 10 is a partial electric diagram of an embodiment of a circuit for controlling a memory cell of the type described in relation with FIGS. 3 to 8.

FIG. 10 is a partial electric diagram of an embodiment of a control circuit capable of supplying the different control voltages of a memory cell of the type described in relation with FIGS. 3 to 9. More specifically, FIG. 10 shows a circuit capable of supplying the different control voltage levels to be applied to node SL to a resistive memory cell of the type described in relation with FIGS. 3 and 4. The circuit of FIG.

10 comprises a high-voltage stage 1001 intended to supply a voltage higher than $V_{DD}$ (particularly, voltage $V_{FORM}$ in the example of FIG. 4). In this example, stage 1001 comprises two P-channel MOS transistors 1003 and 1005 in series between node SL and a node N1 of application of a constant positive voltage greater than $V_{DD}$, in the order of $2*V_{DD}$ in this example. As a variation, to have a choice between a plurality of voltages in the range from $V_{DD}$ to $2*V_{DD}$, a plurality of assemblies of cascoded transistors may be connected in parallel between node SL and node N1. The circuit of FIG. 10 further comprises a low-voltage stage 1007 intended to supply voltages in the range from voltage GND, or ground voltage, to voltage $V_{DD}$ (particularly, voltages $V_{SET}$ and $V_{READ2}$ in the example of FIG. 4). In this example, stage 1007 comprises a first inverter 1009 having a low power supply node connected to ground and having a high power supply node connected to a node N2 of application of a first constant positive voltage smaller than or equal to $V_{DD}$, in the order of $V_{DD}/2$ in the present example. In this example, stage 1007 further comprises a second inverter 1011 having a low power supply node connected to an output node s1 of inverter 1009 and having a high power supply node connected to a node N3 of application of a second constant positive voltage smaller than or equal to $V_{DD}$ and higher than the first voltage, in the order of $V_{DD}$ in the present example. An input node e1 of inverter 1009 is capable of receiving a control voltage in the range from voltage GND to voltage $V_{DD}$, and an input node e2 of inverter 1011 is capable of receiving a control voltage in the range from voltage GND to voltage $V_{DD}$. An output node s2 of inverter 1011 is coupled to node SL by an N-channel MOS transistor 1013 enabling to disconnect low-voltage stage 1007 of node SL when a voltage higher than $V_{DD}$ is applied to node SL by high-voltage stage 1001.

Specific embodiments have been described. Various alterations, modifications, and improvements will readily occur to those skilled in the art.

In particular, based on the above-described examples, it will be within the abilities of those skilled in the art to provide other configurations of elementary cells, particularly by reversing the biasing of the storage elements, and/or by modifying the conductive types of the MOS transistors.

Further, although examples of control methods where the phases of reading (READ) from the resistive cells are voltage readings have been described, it will occur to those skilled in the art that the above-described cells are compatible with a current reading (that is, a reading where, to determine the resistivity state of the storage element, a fixed voltage is applied across the storage element, and the current flowing through the storage element is measured).

More generally, the described embodiments are not limited to the above-described control methods.

In particular, the described embodiments are not limited to the specific example of elementary cell interconnection diagram described in relation with FIG. 8.

Further, various embodiments with different variations have been described hereabove. Those skilled in the art may combine various elements of these various embodiments and variations without showing any inventive step.

The invention claimed is:

1. A non-volatile memory comprising a plurality of elementary cells arranged in rows and in columns, each cell comprising:
   a first access transistor coupling first and second nodes of the cell;
   a second access transistor coupling the first node to a third node of the cell, wherein the first and second transistors are MOS transistors of opposite conductivity types, or wherein the first and second transistors have different dimensions or wherein the first and second transistors are MOS transistors of opposite conductivity types and have different dimensions; and
   a single programmable-resistance storage element connected to the first node, this storage element coupling the first node to a fourth node of the cell,
   wherein, in each row, the cells have their fourth nodes connected by a first row-connection conductive track, and the gates of their first transistors connected by a second row-connection conductive track, and wherein, in each column, the cells have their second nodes connected by a first column-connection conductive track and their third nodes connected by a second column-connection conductive track,
   the memory further comprising a control circuit connected to the cells via the first and second row-connection conductive tracks and the first and second column-connection conductive tracks, this circuit being configured for:
   during a phase of programming a cell to a first state, applying a voltage of a first biasing across the storage element of the cell via the fourth and second nodes and the first transistor of the cell, the second transistor of the cell being maintained off; and
   during a phase of programming the cell to a second state, applying a voltage having an opposite biasing across the storage element of the cell via the fourth and third nodes and the second transistor of the cell, the first transistor of the cell being maintained off.

2. The memory of claim 1, wherein the control circuit is further capable, during a phase of reading a cell, of: precharging the second node of the cell to a first voltage; applying a second voltage different from the first voltage to the fourth node of the cell; controlling the first transistor to the on state; and then measuring a variation of the voltage of the second node relative to the first voltage.

3. The memory of claim 1, wherein, in each cell, the gate of the second transistor is connected to a node of application of a fixed voltage.

4. The memory of claim 1, wherein, in each cell:
   the difference between the voltage applied to the first node during the phase of programming the cell to the first state and the voltage applied to the first node during the phase of programming the cell to the second state is greater than the maximum gate-source or gate-drain voltage that the first and second transistors can withstand without being damaged; and
   the voltages applied to the gates of the first and second transistors during phases of programming the cell to the first and second states have an intermediate level between the voltage applied to the first node during the phase of programming the cell to the first state and the voltage applied to the first node during the phase of programming the cell to the second state.

5. The memory of claim 1, wherein, in each cell, the first transistor is an N-channel MOS transistor, and the second transistor is a P-channel MOS transistor.

6. The memory of claim 1, wherein each cell further comprises:
   a third access transistor coupling a fifth node to a sixth node of the cell;
   a fourth access transistor coupling the fifth node to the third node of the cell; and a single programmable-resistance storage element connected to the fifth node, this storage element coupling the fifth node to the fourth node of the cell.

7. The memory of claim 6, wherein, in each cell, the gate of the third transistor is connected to the gate of the first transistor, and the gate of the fourth transistor is connected to the gate of the second transistor.

8. The memory of claim 6, wherein, in each cell, the first and third transistors are of the same conductivity type, and the second and fourth transistors are of the same conductivity type.

* * * * *